(12) United States Patent
Yamamoto et al.

(10) Patent No.: US 6,845,112 B2
(45) Date of Patent: Jan. 18, 2005

(54) SEMICONDUCTOR LASER AND METHOD FOR MANUFACTURING THE SAME

(75) Inventors: Takeshi Yamamoto, Kyoto (JP); Masayoshi Muranishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/431,511

(22) Filed: May 8, 2003

(65) Prior Publication Data

US 2003/0210719 A1 Nov. 13, 2003

(30) Foreign Application Priority Data

May 9, 2002 (JP) ........................................ 2002-134389
Feb. 19, 2003 (JP) ........................................ 2003-041059

(51) Int. Cl.[7] .............................. H01S 3/04; H01S 5/00
(52) U.S. Cl. ......................................... 372/36; 372/43
(58) Field of Search ............................... 372/43–50, 36

(56) References Cited

U.S. PATENT DOCUMENTS 4,686,678 A * 8/1987 Ohta et al. ..................... 372/33
5,485,479 A * 1/1996 Kitamura et al. ............. 372/43
5,878,069 A    3/1999 Kamibayashi et al.

FOREIGN PATENT DOCUMENTS

JP         2001-111152      4/2001

* cited by examiner

Primary Examiner—Quyen Leung
(74) Attorney, Agent, or Firm—Arent Fox PLLC

(57) ABSTRACT

A stem is formed by fixing two leads to a base having a planar shape that is substantially circular to be remote from one diameter thereof by a specified distance and by providing a heat sink onto one surface side of the base to have a surface that is parallel to the two leads and that is perpendicular to the base. A laser chip is mounted onto one surface of the heat sink and a periphery thereof is covered by a cap. The heat sink is fixedly attached such that an emitting portion of the light of the laser chip becomes in center of the base. It is accordingly possible to obtain a semiconductor laser of an arrangement having a small outer diameter and that may be easily manufactured at low cost while increasing the size of the heat sink for improving the heat radiation properties even if the laser chip has a large chip size and a large heat generating in a high output laser chip, and accordingly an optical pickup of thin type.

12 Claims, 7 Drawing Sheets

SEMICONDUCTOR LASER AND METHOD FOR MANUFACTURING THE SAME

FIELD OF THE INVENTION

The present invention relates to a semiconductor laser which is formed to be of small size and which may be manufactured at low costs in a simple manner, the laser being particularly suitable for use as a pickup light source for DVDs (digital versatile disks), DVD-ROMs, or CD-R/RW (rewritable CDs) to which data may be written. More particularly, it relates to a semiconductor laser, a method for manufacturing the same and an optical pickup device employing the semiconductor laser, wherein the semiconductor laser is of stem-type structure that may be designed to be of small size and that may be manufactured simply at low costs even if a laser chip becomes larger for use as a pickup of DVD or CD-R/RW.

BACKGROUND OF THE INVENTION

A conventional semiconductor laser of stem type that is used as a pickup for a CD has such a structure as illustrated in FIG. 8. More particularly, a stem 20 is used that is formed by cold forging a metallic material such as iron for forming a heat sink portion 22 by raising remote of a central portion of a base 21 and by fixing leads 23, 25 therein by means of glass 26 or similar; a laser chip 31 is mounted onto this heat sink portion 22 through a sub-mount 34 comprised of a silicon substrate or the like; one electrode (rear surface of the chip 31) is electrically connected to the lead 23 through a wire 33 via are lay portion 38 of the sub-mount 34 while the other electrode is connected to the sub-mount 34 through a wire 33 to be electrically connected to a common lead 24 through the heat sink portion 22 and the base 21 via a rear surface of the sub-mount 34.

It should be noted that 32 denotes alight receiving element for monitoring, wherein one electrode is electrically connected to the lead 25 via the wire 33 while the other electrode is electrically connected to the common lead 24 via the sub-mount 34, the heat sink portion 22 and the base 21. A cap 35 is finally covered onto the periphery thereof. A throughhole 35a is provided at a central portion of a top portion of the cap 35 such that light emitted by the laser chip 31 may pass through, and a glass plate 36 is sealed thereon by means of an adhesive 37.

Despite of the fact that the heat sink portion 22 needs to be formed between the leads 23 and 25 in this structure, it is necessary to seal the leads 23, 25 by glass 26 so that the radius of the stem 20 can not be reduced. This is the reason why figurations of conventional stems could be reduced up to approximately 5.6 mmφ only.

On the other hand, demands for extremely thinning in recent pickups for CDs and DVDs are increasing accompanying light and compact structure of electronic devices as represented by notebook type personal computers. As for pickups, semiconductor lasers of small outer diameter are being required which are used in horizontally turned conditions, wherein it is desirable to set the outer diameter to not more than approximately 3.5 mmφ, and it has been developed for semiconductor lasers that are arranged in that, as illustrated in FIG. 9, a stem 20 is formed by performing deep drawing of a plate-like body for integrally forming a ring 27 and a seating portion 28 that performs the function of the heat sink, wherein leads 23, 25 are directly sealed into the ring 27 through glass 29 or the like, and a cap 35 is covered onto the outer periphery of the stem 20 through press-fitting (for instance, U.S. Pat. No. 5,878,069). By employing such a structure, the heat sink needs not be directly formed onto the base of the stem, and since no space for welding the cap is required, it is possible to achieve a structure having an outer diameter of approximately 3.3 mmφ. It should be noted that portions that are identical to those of FIG. 8 are marked with the same reference numerals, and explanations thereof will be omitted.

However, since the heat sink 22 is formed between the leads 23, 25 in such a structure, the heat sink will necessarily be reduced in size accompanying the downsizing. In laser chips for CDs having a small chip size of approximately 0.25 mm by 0.25 mm square and having a small operating current, it would not mind even if the shape of the heat sink becomes small, but in laser chips for DVDs having a large chip size of approximately 0.25 mm by 0.5 mm square and having a large heat generating, insufficient radiation resulted in a drawback of lack of light emission of the laser chip.

The inventors of the present invention have thus developed a semiconductor laser that satisfies the requirements for downsizing of the entire package without degrading the heat radiation properties upon securing a size for the heat sink that is equivalent to that of above-described heat sink of stem type as illustrated in FIG. 8 (for instance, Japanese Patent Laid-Open Publication No. 2001-111152; U.S. application Ser. No. 09/684,954). That is, as illustrated in FIG. 10, a heat sink 22, which is provided on one surface side of a base 21 into which at least two leads 23, 25 are fixed as to project to both sides, includes a supporting portion 22a that is fixedly attached to the base and a mounting portion for the laser chip, having a different shape from the supporting portion 22a and the heat sink 22 (mounting portion) is formed to extend to the side of the two leads 23, 25. By employing such an arrangement, it is possible to form the laser chip mounting surface to be of broad width to thus improve the heat radiation properties and to narrow the distance between the leads 23, 25. The diameter of the stem 20 may be accordingly made smaller and it is possible to mount a laser chip for a DVD also when its size is approximately 3.3 mmφ. It should be noted that portions that are identical to those of FIG. 8 are marked with the same reference numerals and explanations thereof will be omitted.

While DVDs are being equipped in notebook type personal computers as standard items accompanying thinning of pickups for DVDs and the like, it is also being wanted for low cost manufacture of pickups and semiconductor lasers in accordance with reductions in prices of notebook type personal computers. However, a conventional structure in which both of downsizing and favorable heat radiation properties have been secured is a structure in which the heat sink and the leads (including glass portions for fixedly attaching the leads) are overlapping (overhanging) when seen on a plan view, so that the heat sink is often composed of two parts or even if the heat sink is of single structure, drawbacks are presented in that manufacturing processes become complicated due to a complicated shape of such a part or in that manufacturing cost is increased even if the structure is of single structure.

Through recent developments in recording media markets, CD-R/RWs are rapidly becoming popular, and they are being on the trend of being equipped as standard items in personal computers, similar to DVDs. Since a semiconductor laser of high output is used as a laser for CD-R/RWs, the laser chip has a size of 0.25 mm by 0.8 mm square that is larger than that of a laser chip for DVDs for the purpose of achieving high output, and it also has an operating current that is four to five times larger than that for CDs. Accordingly there is a problem that a desired optical output can not be achieved if the dispersion of heat of a semiconductor laser chip is not enough when downsizing of a semiconductor laser of high output.

SUMMARY OF THE INVENTION

The present invention has been made in view of the above circumstances, and it is an object thereof to provide a semiconductor laser which is arranged to be of small outer diameter and that may be manufactured at low costs in a simple manner while increasing the size of the heat sink for improving the radiation properties also when using a laser chip such as a laser chip of high output which chip size is large and which has a large heat generating.

It is another object of the present invention to provide a semiconductor laser of an arrangement that may be used without performing changes in design of circuit board of a pickup and without performing changes in shape of a housing.

It is still another object of the present invention to provide a semiconductor laser of low height by enabling mounting of a laser chip between leads with a stem of small outer diameter even when using a laser chip such as one for CD-R/RWs which is of high output, of large chip size and of large heat generating.

It is still another object of the present invention to provide a method for manufacturing a semiconductor laser in which the outer diameter may be made small and the height reduced while having a large laser chip.

It is still another object of the present invention to provide an optical pickup device of low costs that is capable of achieving thinning of an optical pickup as one employed in a notebook type personal computer and of achieving thinning of an electronic device accordingly.

A semiconductor laser according to the present invention includes; a base having a planar shape that is substantially circular, two leads that are respectively fixed to the base through insulating material, a heat sink that is provided on one surface side of the base, the heat sink having a surface that is parallel to a plane formed by the two leads, the surface being perpendicular to the base, and a laser chip that is fixedly attached to the surface of the heat sink, wherein the two leads are provided to be substantially parallel to one diameter of the base and remote by a specified distance from the one diameter, and wherein the heat sink is fixedly provided to the base such that the heat sink does not contact the insulating material for fixing the leads and such that an emitting portion of the laser chip is located in center of the base.

Here, a "substantially circular base" does not mean only one of a perfect circle but also includes one formed with a plurality of positioning slots at peripheral end portions of the base or one with some part of peripheral end portions of the base being missing. The one diameter of the base includes a diameter that may be deemed to have no lacks when end portions are partially missing by the provision of positioning slots and so on.

By employing such a structure, two leads will be formed while being remote from the one surface of the heat sink onto which the laser chip is bonded when seen in a plan view (seeing the stem from above) so that it is possible to sufficiently secure a cubic volume for the heat sink even when the distance between the leads is narrow, and since it is not necessary to overhang the lead and the heat sink, the heat sink may be formed as a single part of simple shape. It is accordingly possible to provide a heat sink that is sufficient for performing radiation of heat also when the distance between leads is narrow for the purpose of achieving an outer diameter of approximately 3.5 mmφ so that it is possible to employ a package of small size also when using a laser chip having a large chip size and a large heat generating such as one for CD-R/RWs, to manufacture the semiconductor laser through simple manufacturing processes and to reduce manufacturing costs through manufacturing the heat sink easily.

By further employing a structure in which a common lead is provided on the other surface side of the base wherein the common lead is fixedly attached at a position that is on a central line between the two leads when seen in a plan view and that is shifted from the peripheral end portion of the base towards a central point of the base by the specified distance, the distance between the common lead and the other leads in the present invention will not be changed from conventional arrangements, and it will be possible to omit the necessity of performing changes in design of a circuit board in a pickup that utilizes a semiconductor laser and to also employ a semiconductor laser of conventional type so as to secure compatibility of the circuit board.

By deforming shapes of tip end portions of the two leads such that a distance (interval) between end tip portions of the two leads on one surface side becomes larger than a distance (interval) between the two leads at portions other than the tip end portions, a laser chip may be mounted between the two leads even if the laser chip is for high output and of large size, and since the heat sink needs not be heightened so as to mount the laser chip upward of the lead end portions, it is possible to obtain a semiconductor laser for high output having a small outer diameter and a low height.

Another embodiment of the semiconductor laser of the present invention includes; a base having a planar shape that is substantially circular, two leads that are respectively fixed to the base through insulating material, a heat sink that is provided on one surface side of the base, the heat sink having a surface that is parallel to a plane that is formed by the two leads, the surface being perpendicular to the base, and a laser chip that is fixedly attached to the surface of the heat sink, wherein shapes of tip end portions of the two leads on the surface side are deformed such that a distance (interval) between the tip end portions of the two leads becomes larger than a distance (interval) between the two leads at portions other than the tip end portions.

It is possible to employ a structure in which the laser chip is fixedly attached to the heat sink through a sub-mount, wherein the sub-mount is made of AlN, and wherein one electrode of the laser chip is electrically connected to the heat sink through wire bonding via a relay conductive member that is provided on a surface of the sub-mount. In other words, it is possible to form a large heat sink without being restricted by distances between leads and to form the heat sink to be of simple shape so that a flat surface of the heat sink to which the laser chip is bonded may be made sufficiently large for securing a space for wire bonding. It is consequently possible to obtain a semiconductor laser of low costs and of high properties without employing an expensive sub-mount in which tungsten via is formed in AlN even when employing a heat sink that is formed of AlN that exhibits high thermal conductivities.

A method for manufacturing a semiconductor laser of claim 3 or 8 according to the present invention includes the steps of; fixing two leads to the base through insulating material so as to pierce through the base, deforming tip end portions of the two leads on the one surface side of the base through press such that the distance between the tip end portions becomes larger than the distance between the two leads at portions other than the end portions, and fixedly attaching the laser chip onto the heat sink that is provided on the one surface side of the base.

An optical pickup device according to the present invention includes; a semiconductor laser, a grating, a beam splitter for splitting the light beam that is emitted from the semiconductor laser and a returning light upon being reflected, a collimator lens which collimates the light beam emitted from the semiconductor laser, a reflecting mirror for bending the light beam from the semiconductor laser into a right-angled direction, an object lens for converging the light beam on a disk and an optical detector for detecting the returning light reflected by the disk and split through the beam splitter, wherein the semiconductor laser is the semiconductor laser of claim 1 or 8.

BRIEF DESCRIPTION OF THE DRAWINGS

FIGS. 2A to 2C are explanatory views for illustrating positional relationship between leads in the semiconductor laser of FIG. 1;

DESCRIPTION OF THE PREFFERED EMBODIMENTS

Figure 1A:
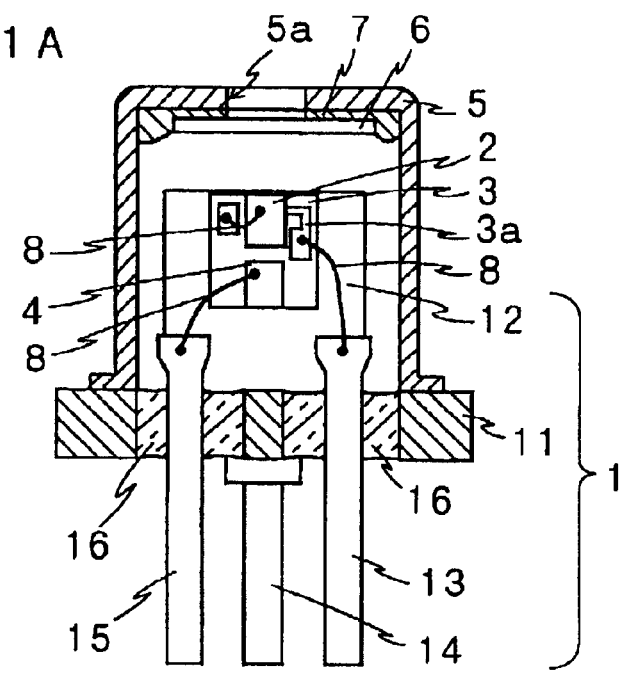
FIGS. 1A to 1C are explanatory views in sectional, perspective (with a cap being detached) and plan view for illustrating a structure according to one embodiment of a semiconductor laser of the present invention.

A semiconductor laser according to the present invention will now be explained while referring to the drawings. A semiconductor laser of the present invention is arranged, as respectively illustrated in FIGS. 1A to 1C as explanatory views in sectional, perspective (of a stem portion) and planar form of one embodiment thereof, in that a stem 1 is formed by fixing two leads 13, 15 to a base 11, which has a planar shape that is substantially circular, through insulating material 16 to be substantially parallel with respect to one diameter of the base 11 and remote therefrom by a specified distance and by providing a heat sink 12 on one surface side of the base 11 that has one surface 12a that is parallel to a plane that is formed by the two leads 13, 15 and that is perpendicular to the base 11.

A laser chip 2 is mounted on the one surface 12a of the heat sink 12, and the periphery thereof is covered by a cap 5. The heat sink 12 is fixedly attached to the base 11 such that it does not come in contact with the insulating bodies 16 for fixing the leads 13, 15 and such that an emitting portion of the light of the laser chip 2 is located centrally of the base 11.

The stem 1 is comprised with the base 11, the heat sink 12, the leads 13, 15 that are sealed, through soft glass 16 or the like, into through holes provided in the base 11, and a common lead 14 provided on the base 11 upon being directly welded thereon. The present invention is characterized in that the heat sink 12 is arranged with the leads 13, 15, which are sealed into the base 11, being not provided on a central line (one diameter) of the base but to be shifted in a parallel manner from one central line to be remote therefrom by a specified distance d (see FIG. 2B) and with the one surface 12a of the heat sink 12 onto which the laser chip 2 is mounted being accordingly upstanding in a perpendicular manner from the base 11 surface to be of identical width such that the emitting portion of light of the laser chip 2 becomes the central position of the stem 1. In other words, while two leads 13, 15 were customarily provided on the central line of the base in a conventional stem of this kind, the leads are provided in the present invention to be shifted from the central line contrary of such customs.

The thickness of the base 11 as illustrated in FIG. 1 is defined to be, for instance, approximately 1 mm while its diameter is defined to be approximately 3.5 mmφ, and the diameter of through holes for fixedly attaching the leads 13, 15 is defined to be, for instance, approximately 0.75 mmφ while a pitch (a distance between central lines) between these is defined to be approximately 1.1 mm.

Figure 10:
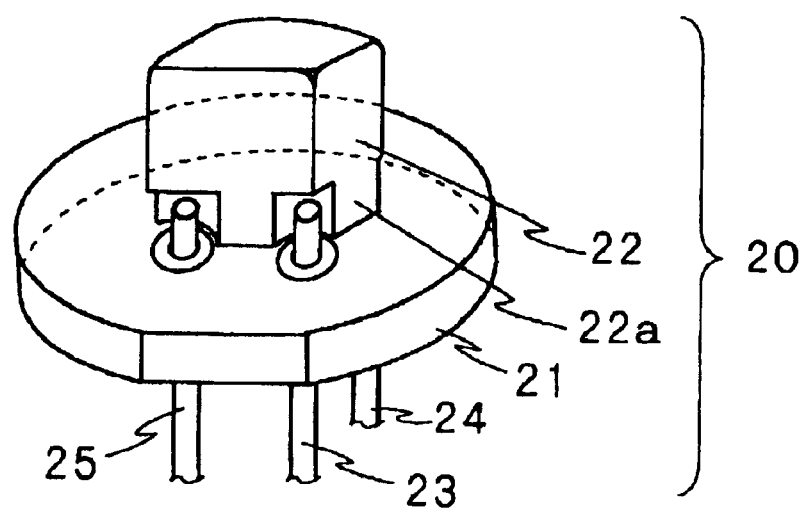
FIG. 10 is an explanatory view of an exemplary structure of a conventional semiconductor laser.

While the distance (pitch) between the two leads 13, 15 is 1.1 mm and thus identical to that of the conventional arrangement as illustrated in FIG. 10, they are formed upon being shifted in a parallel manner from one diameter A (see FIG. 2B) by the specified distance d, for instance, 0.3 mm. Consequently, as will be described later, the heat sink 12 is allowed to be larger while maintaining the relationship between the three leads to be identical the relationship of the prior art arrangement when the common lead 14 is provided to be shifted towards the central side of the base 11 by the same distance d.

The leads 13, 15 may be made of Fe—Ni alloy rods of, for instance, 0.3 mmφ, and are sealed into the through hole of the base 11 through glass beads made of soft glass 16 or the like. The common lead 14 may be made of KOVAR (registered trademark; Fe—Ni—Co alloy) and is directly attached to another surface (rear surface) of the base 11 in a fixed manner for electric welding with the base 11.

Figure 2A:
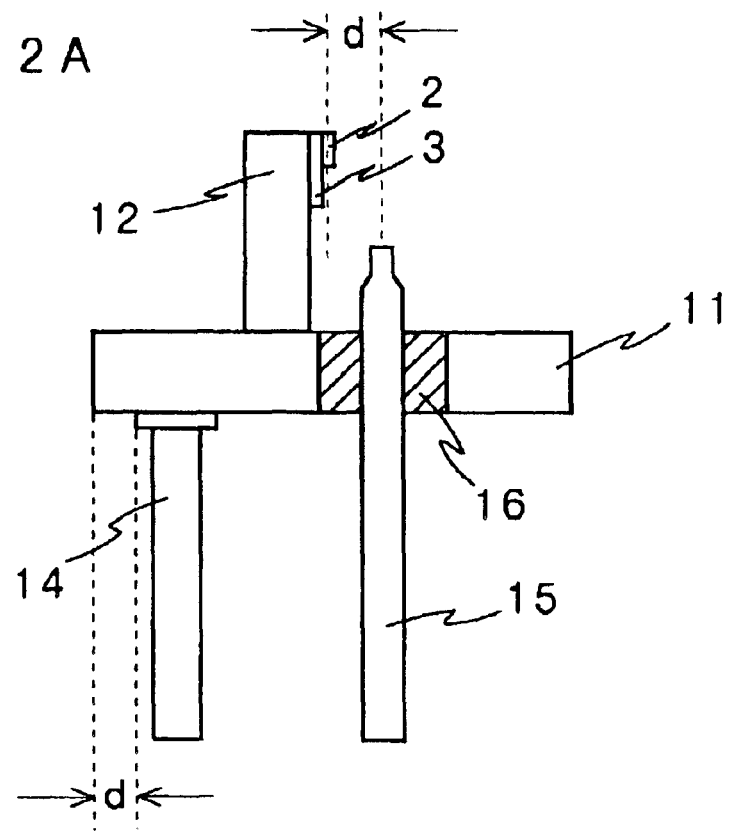
Figure 2B:
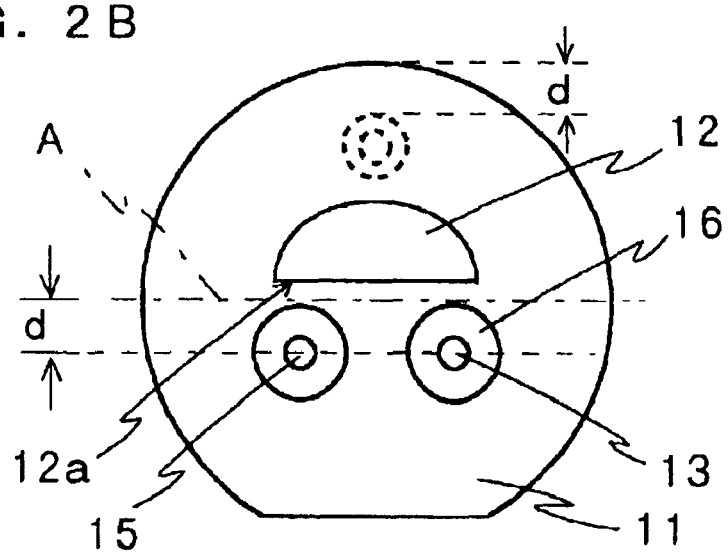

As illustrated in FIG. 2, it is preferable that the common lead 14 is fixedly attached at a position that is on the central line of the two leads 13, 15 and remote from the peripheral end portion of the base 11 by the same distance d as the distance d by which the two leads 13, 15 are remote in a parallel manner from the one central line (diameter) A of the base 11. With this arrangement, the relationship between the common lead 14 and the other leads 13, 15 will be identical to those of conventional arrangements so that it is possible to omit the necessity of performing changes in design of a circuit board in a pickup utilizing the semiconductor laser and also to employ a semiconductor laser of conventional type and thus to further secure compatibility of the circuit board.

In the example as illustrated in FIG. 1, the heat sink 12 is made of a copper block exhibiting favorable thermal conductivity, and includes a laser chip mounting surface 12a, which is one substantially planar surface onto which the laser chip 2 is mounted, while another surface is formed to have an arc-like sectional shape wherein this sectional shape is maintained substantially identical from a top surface to a bottom surface with this bottom surface being fixedly attached to the base 11 through brazing or the like. The laser chip mounting surface 12a is formed to have a width of approximately 1.4 mm. While flattening processes are performed after fixing the same to the base since flatness is particularly required for such a surface when mounting the sub-mount 3 or for performing wire bonding, the simple shape of the heat sink 12 of the present invention enables it to easily obtain a broad flat surface area, and electric connection with the heat sink 12 through wire bonding may be achieved also when employing AlN for the sub-mount 3 as it will be described in the following another embodiment (FIG. 4).

Using an iron block instead of a copper block for the heat sink 12 will be of no problem as long as there is any ability of heat radiation and it will further be of advantage in view of even lower manufacturing costs. It is also possible to integrally form the base 11 and the heat sink 12 through cold forging by using an iron plate or the like. Such integral formation will lead to an advantage in that it is possible to accurately manufacture the heat sink 12 without the necessity of fixedly attaching the same. It should be noted that the heat sink 12 is not limited to one in which the sectional shape of the other surface is arc-like, and it will be of no problem as long as the sectional shape remains substantially identical from the top surface to the bottom surface and the above-described laser chip mounting surface 12a is formed.

Figure 3:
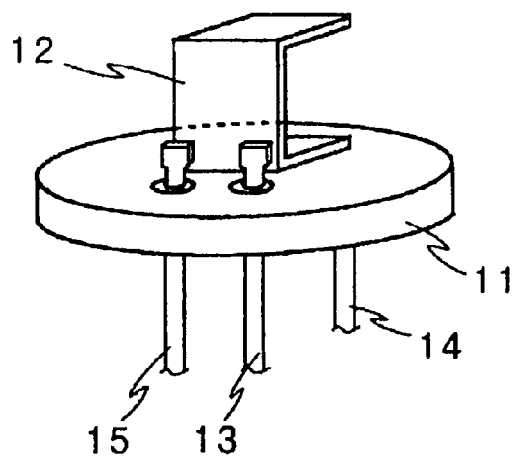
FIG. 3 is an explanatory view for illustrating a structure according to another embodiment of a semiconductor laser of a present invention.

In an alternative example as illustrated in FIG. 3 in which a perspective explanatory view of a similar stem portion is illustrated, it is also possible to employ an arrangement in which the heat sink 12 is formed by punching and bending a copper plate and in which the heat sink 12 is fixedly attached to the base through welding or brazing. In this example, a large surface area may be formed within a limited space and its radiation properties improved by bending the heat sink portion as illustrated in FIG. 3. The remaining portions are identical to those of the above-described example, wherein the same portions are marked with the same reference numerals and explanations thereof will be omitted.

Figure 1B:
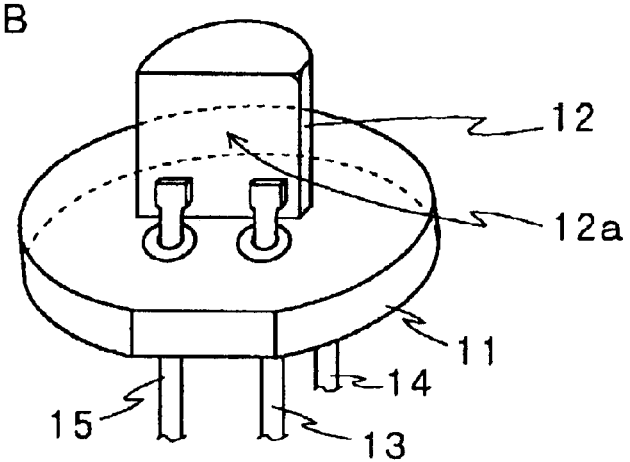
Figure 1C:
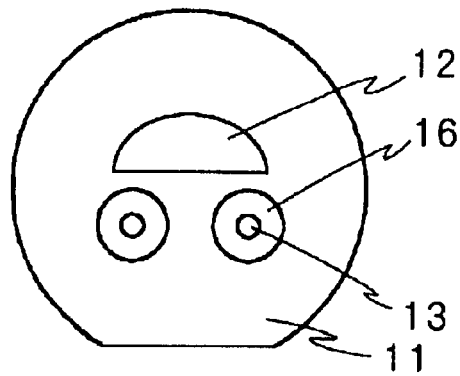

While the laser chip 2 is formed such that laser beam is emitted therefrom, its size for CDs is approximately 250 $\mu$m by 250 $\mu$m, approximately 250 $\mu$m by 500 $\mu$m for DVDs and approximately 250 $\mu$m by 800 $\mu$m for CD-R/RWs. Still being extremely small, such a laser chip is usually bonded onto a sub-mount 3 made of a silicon substrate or AlN (aluminum nitride) having a size of approximately 0.8 mm by 1 mm for enabling easy handling thereof and for securing heat radiation. As illustrated in FIG. 1A one electrode is connected to the sub-mount 3 through wire bonding using a gold wire 8 or similar and further connected to the common lead 14 from the rear surface via the heat sink 12 and the base 11 by using a conductive adhesive while the other electrode (rear surface electrode) is connected to the lead 13 through wire bonding using a gold wire 8 or the like via a connecting portion 3a on the sub-mount 3.

The sub-mount 3 onto which the laser chip 2 has been bonded is transferred by a die-bonding collet (adsorption collet) and is mounted onto the heat sink 12. A light receiving element 4 for monitoring emission output of the laser chip 2 is similarly provided on the sub-mount 3 which one electrode is connected to the common lead 14 through the heat sink 12 while the other electrode is electrically connected to the lead 15 through wire bonding using a gold wire 8 or the like. It should be noted that the light receiving element 4 might be provided separate from the sub-mount 3 or the light receiving element 4 might also be omitted if not required.

A cap (shell) 5 is provided around the laser chip 2 by being welded to the stem 1. More particularly, a projection (protrusion) is provided over the entire periphery of a bottom surface of the cap 5 (portion contacting the base 11) and the entire periphery is hermetically sealed through resistance welding or similar such that the current will concentrate at this portion. While it is preferable that the cap 5 is made of a material of favorable thermal conductivity such as copper, it is also possible to employ a metal of favorable weldability such as iron or KOVAR (registered trademark). In view of preventing scattering reflection of light at an inner surface, it is preferable to perform non-luster silver plating or similar. A window portion (through hole) 5a through which laser beam passes is provided at a central portion of a top portion of the cap 5 and a transparent plate 6 made of glass or similar is adhered to the window portion 5a through an adhesive 7 such as low-melting glass.

According to the semiconductor laser of the present invention, the lead position is disposed to be shifted to remote from the heat sink 12 in a frontward side of the laser chip mounting surface 12a of the heat sink 12 so that it is not required to overhang the lead 13, 15 and the heat sink 12, and the heat sink may be formed as a single part of simple shape. It is consequently possible to obtain a single part of simple shape and to obtain an arrangement that may be manufactured through simple manufacturing processes requiring no fixing process of two parts so as to simplify the manufacture of the heat sink portion and to achieve reductions in manufacturing costs. That is, while drawbacks were presented in conventional arrangements in which the lead and the heat sink were formed as an overhanging arrangement for reducing the distance between leads and for enlarging the heat sink, in which the heat sink was composed of two parts or of complicated shape even if a single part structure was achieved, and in which the shape of a portion of the heat sink which is fixedly attached on the stem was required to be small so that it was necessitated to decrease the cubic volume of the heat sink to some extent, it has been enabled by the present invention to achieve a single part structure of simple shape and to obtain an arrangement that may be manufactured through simple manufacturing processes requiring no fixing process of two parts so as to simplify the manufacture of the heat sink and to achieve reductions in manufacturing costs.

Also with the distance (interval) between leads being small for achieving an outer diameter of approximately 3.5 mm$\phi$, it is not necessary to reduce the cubic volume of the heat sink but to rather increase it for providing a heat sink sufficient for radiation of heat. It is consequently possible to obtain a small-sized package also for a laser chip as one for CD-R/RWs which is of large chip size and of large heat generating.

The height of the heat sink 12 is formed to be large in the above-described example such that the sub-mount 3 may be mounted onto the heat sink 12 upward of the tip end portions of the leads 13, 15. The reason for this is that mounting cannot be performed by passing the space between the leads when mounting upon absorbing the sub-mount by means of the die-bonding collet since the pitch of the two leads 13, 15 is approximately 1.1 mm and the tip ends thereof are flattened such that the interval between the tip end portions becomes smaller than 0.8 mm while the width of the sub-mount 3 is approximately 0.8 mm. The height of the entire semiconductor laser with the cap 5 being covered thereon will accordingly become large and thus does not sufficiently cope with demands for low height and compactness of electronic devices in these years. In view of these facts, an arrangement enabling further downsizing is illustrated in FIGS. 4A and 4B similar to FIGS. 1A and 1B.

Figure 4A:
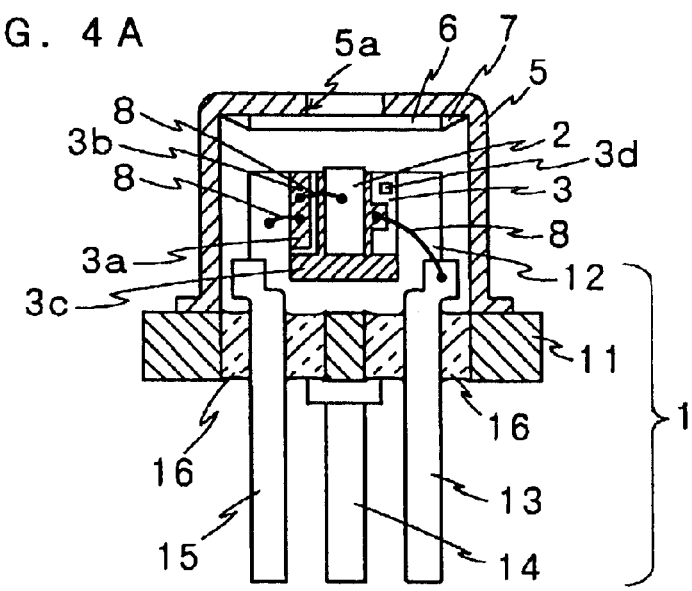
FIGS. 4A and 4B are explanatory views in sectional and perspective (with a cap being detached) form for illustrating a structure according to the other embodiment of the semiconductor laser of the present invention.
Figure 4B:
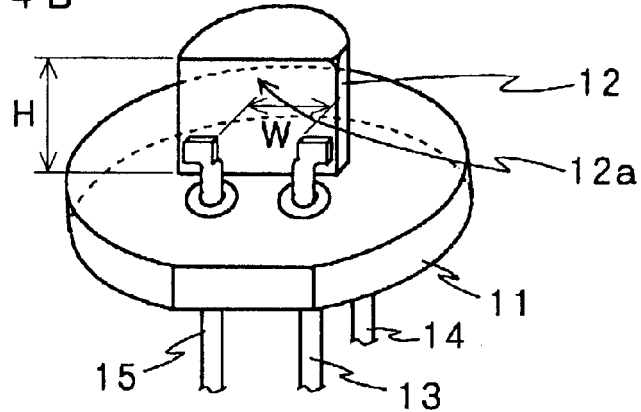

In the arrangement as illustrated in FIGS. 4A and 4B, by employing an arrangement in which tip end portions of the leads 13, 15 of the laser chip 2 side (the side that is covered by the cap 5; the inner leads) are deformed through press processing so as to increase the interval between them and in which the sub-mount 3 is disposed at the widened space between the leads, the height of the heat sink 12 is formed to be small. In the example as illustrated in FIG. 4, a high output laser chip for CD-R/RWs (having a dimension of, for instance 0.8 mm length (longitudinal direction in FIG. 4A) by 0.25 mm wide (horizontal direction of FIG. 4A) is employed as a laser chip 21 and a sub-mount 31 is not made of a silicon substrate but is made of AlN that exhibits even superior thermal conductivity. The remaining arrangements are identical to those as illustrated in FIG. 1, wherein the same portions are marked with the same reference numerals and explanations thereof will be omitted. It should be noted that it is generally the case that a light receiving element for monitoring is separately provided from the semiconductor laser in an optical pickup device employing such a type of high output semiconductor laser, and no light receiving element is illustrated in the example as shown in FIG. 4, either.

In the example as illustrated in FIG. 4, the tip end portions of the leads 13, 15 of the laser chip 21 side (tip end portion of the inner leads) are press processed such that the interval between the tip end portions of the inner leads will be larger than the interval between the leads 13, 15 on the opposite side of the base 11 (outer leads). For instance, the interval between the outer leads is approximately 0.8 mm (having a lead pitch of 1.1 mm and a lead thickness of 0.3 mm) while a distance (interval) W between the tip end portions of the inner leads (see FIG. 4B) is defined to be approximately 1.05 to 1.15 mm. Processing of the lead tip end portions may be performed by press processing upon performing the processes as illustrated in FIGS. 5A to 5E.

Figure 5A:
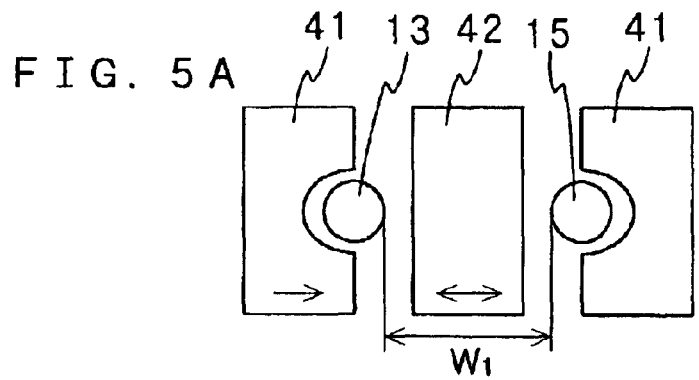
FIGS. 5A to 5E are explanatory views illustrating one example of processes for forming a stem of FIG. 4.

First, similar to forming a conventional stem, the leads 13, 15 made, for instance, of Fe—Ni alloy are sealed in to a through hole of the base 11 through soft glass 16 or the like (see FIG. 4A). Then, as illustrated in FIG. 5A, dies 41 formed with a concave are respectively disposed outside of both lead tip end portions (opposite side of the other lead within a surface on which the two leads are aligned) are pressed through a punch 42 that abuts only the tip end portions of the leads from inside of the lead (between the two leads). Since the distance $W_1$ between the leads at this time is approximately 0.8 mm, the plate-like punch will be approximately 0.5 mm but tip ends of the thin and soft leads 13, 15 may be processed by forming the punch 42 of a material of large mechanical strength such as cemented carbide. It should be noted that the punch 42 may be arranged to perform pressure in only one direction such that a tip end portion of one lead is first deformed whereupon the stem is rotated by 180° for similarly deforming the other lead.

Figure 5B:
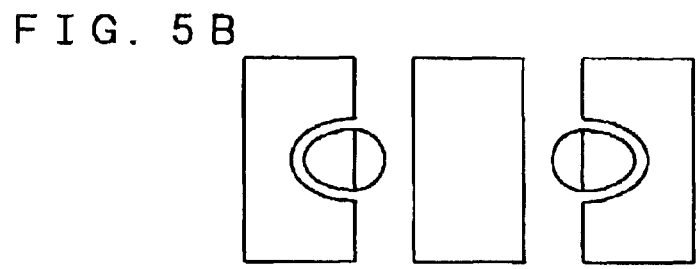

As a result, only portions of the lead tip end portions that have been pressed by the punch 42 are pushed to outside while the inside end portions are deformed to be proximate to the original central line of the leads or to be further outward therefrom as illustrated in FIG. 5B.

Figure 5C:
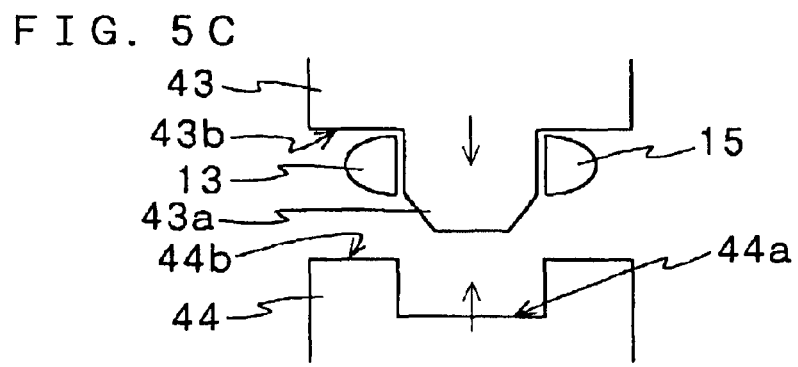
Figure 5D:
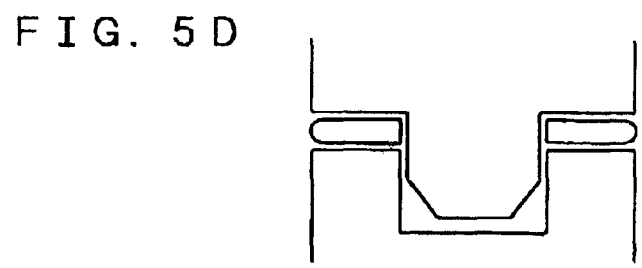
Figure 5E:
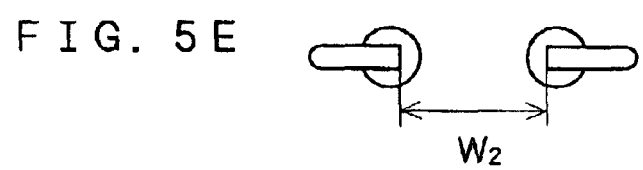

Then, as illustrated in FIG. 5C, the tip end portions of leads 13, 15 are pressed by a second punch 43 having a convex portion 43a of a width corresponding to the expanded distance between the leads and a flat surface 43b that is perpendicular to the convex portion 43a, which is inserted to between the leads, and a second dice 44 having a concave portion 44a escaping from the convex portion 43a of the second punch 43 and a flat surface 44b opposing the flat surface 43a. Consequently, while the leads 13, 15 are suppressed by the flat surface 43b of the second punch and the flat surface 44b of the second dice, they will not be pressed towards a gap side (inner side) of the leads 13, 15 but towards outside (see FIG. 5D) due to the provision of the concave portion 43a of the second punch 43. Upon detaching the second punch 43 and the second dice 44, the distance $W_2$ is expanded to, for instance, approximately 1.1 mm as illustrated in FIG. 5E and since planar portions are formed at the tip end portions, it is possible to obtain a shape of the leads with which it is possible to perform wire bonding.

Through the above press processes, the interval (distance) W between the tip end portions of the leads 13, 15 is expanded to be approximately 1.1 mm as illustrated in FIG. 4 so that the sub-mount may be mounted between the leads while also taking tolerances of shifts in positioning into consideration when the sub-mount of 0.8 mm width is transferred by a die-bonding collet having a width of approximately 0.9 mm for mounting the sub-mount onto the heat sink 12. As a result, the sub-mount may to be mounted at a position closer to the base 11 side as illustrated in FIG. 4 and the height of the heat sink 12 is decreased correspondingly. The height H of the heat sink 12 at this time was approximately 1.3 mm so that the height could be reduced by 1.15 mm than compared to the height as shown in FIG. 1 of 2.45 mm. It should be noted that the method for processing the lead tip ends is not limited to that as illustrated in FIG. 5, and the processes of bending outward and the processes of forming the flat portion may alternatively be simultaneously performed through a die for forming or preliminarily processed leads may be fixedly attached to the base. On the other hand, the distance between the leads on the opposite side of the base 11, that is, the outer leads is identical to that of the arrangement as illustrated in FIG. 1, and any kind of changes in the test equipment of the semiconductor laser or in a socket for assembling the optical pickup device may be not occurred.

In the example as illustrated in FIG. 4, AlN (aluminum nitride) is employed for forming the sub-mount 3 as described above. The reason for this is that a material having a thermal conductivity that is more favorable than that of silicon is preferred since laser chips of high output as those for CD-R/RWs generate a high heat. When employing such AlN, it is generally the case that an AlN substrate embedded with conductive body referred to as tungsten via is provided. This is because this arrangement enables electric connection to a rear surface of AlN that exhibits insulating properties without requiring any bonding space, but a drawback is presented in that an AlN substrate provided with tungsten via is of extremely high costs.

However, since the embodiment as illustrated in FIG. 4 employs an AlN substrate without via instead of an AlN substrate formed with such tungsten via wherein wire bonding of a gold wire 8 is performed via a relay conductive member (metalize layer) 3b formed on the surface of the sub-mount 3, one terminal of the laser chip 2 is electrically connected to the lead 14 via the heat sink 12. The reason why it is possible to perform connection through wire bonding in such a small-sized semiconductor laser by using an AlN substrate having no tungsten via is as follows.

In particular, as explained with reference to the above-described embodiment of FIG. 1, since the heat sink maybe formed to be large and to be simple shape upon shifting the leads 13, 15 from the central line of the base (position of the diameter), it is possible to form the flat surface of the heat sink 12 not only for the mounting area for the sub-mount 3 but also for the area for performing wire bonding. It is accordingly possible to perform wire bonding on the heat sink 12 adjacent to the sub-mount 3 as illustrated in FIG. 4. It is accordingly enabled to electrically connect one terminal of the laser chip 2 to the lead 14 via the heat sink 12 through wire bonding while employing an AlN substrate without via instead of employing an AlN substrate of high costs embedded with tungsten via.

It should be noted that in FIG. 4, 3c denotes a metalize layer for die-bonding wherein the laser chip 2 is bonded on its surface through an Au—Sn brazing material or the like wherein the other electrode terminal of the laser chip is electrically connected to the lead 13 via the metalize layer 3c for die-bonding through wire bonding using a gold wire 8 or the like. 3d denotes an alignment mark for performing positioning of parts, and AlN are exposed from other portions.

By employing the arrangement as illustrated in FIG. 4, the sub-mount 3 may be mounted also at a height position of the tip end portions of the leads so that the height H of the heat sink 12 may be reduced to be approximately 1.3 mm as described above. The height of the cap 5 may consequently be reduced to reduce the height of the overall semiconductor laser. Accordingly, it is not only possible to reduce the thickness of the optical pickup device but also to reduce the figuration (height) thereof.

Figure 6A:
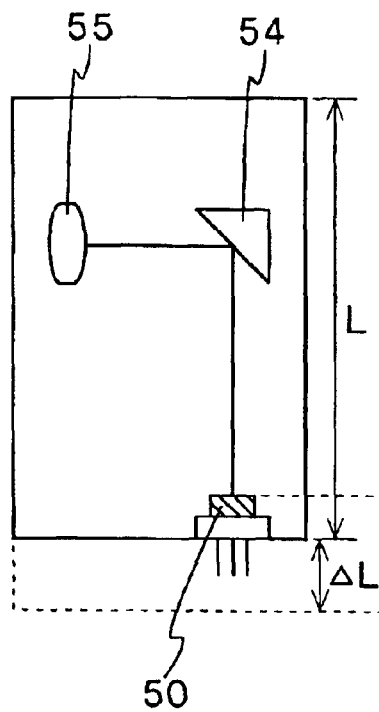
FIGS. 6A and 6B are views for explaining that an optical pickup device may be downsized when employing the semiconductor laser of the structure as illustrated in FIG. 4.
Figure 6B:
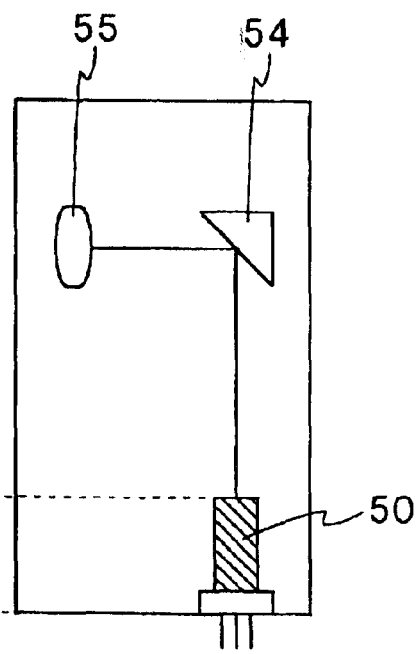

While the arrangement of the optical pickup device will be described later with reference to FIG. 7, as illustrated in outline view seen in plan view as shown in FIGS. 6A and 6B, a semiconductor laser 50 is arranged to be horizontally turned so the beam passes horizontally, the beam being turned by 90° through a prism mirror 54 for convergence onto a disk through an object lens 55, wherein the length L of the optical pickup device may be shortened by ΔL, that is, 1.15 mm as described above by reducing the height of the semiconductor laser 50. It should be noted that reduction in the diameter of the stem of the semiconductor laser contributes to reduction in the vertical direction in FIG. 6, that is, the thickness.

Since it is not only possible to reduce the thickness of the optical pickup device due to reducing the outer diameter of the semiconductor laser but also to reduce its height due to shortening the length of the optical pickup device, by employing the arrangement as shown in FIG. 4, the optical pickup device is allowed to be of extremely small size. Moreover, since the pitch between the outwardly appearing leads (outer leads) will be identical to those of the prior art so that sockets for connection with a power source may be those as conventionally used.

According to the present invention, the heat sink may be formed to be of simple shape but of large size while the package is of small size by shifting the position of the leads so that it is possible to secure a flat space for performing wire bonding on a mounting surface of the heat sink and it is possible to obtain a semiconductor laser of high output at extremely low costs since expensive AlN sub-mount embedded with tungsten via need not be employed even when forming the sub-mount of AlN that exhibits superior thermal conductivity.

The above-described arrangement as illustrated in FIG. 4 is not limited for use with those of high output (for DVDs or CD-R/RWs) but the width of the sub-mount is same also for use with those of low output such as for CDs (the width of laser chip is identical while the length differs depending on the output) and the sub-mount may be mounted closer to the base by widening the interval at the tip end portions of the leads. When used with one for low output, the size of the heat sink need not be increased that much and since a silicon substrate may be used as the sub-mount, it is alternatively possible to form the stem without shifting the leads from the central line of the base as illustrated in FIGS. 1 and 4.

Figure 7:
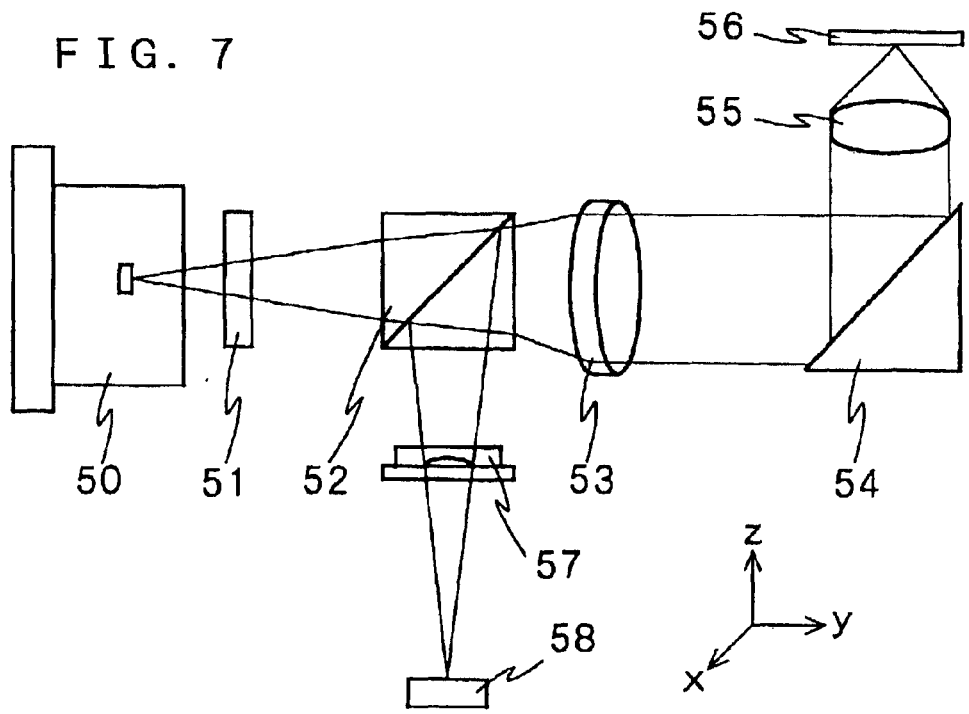
FIG. 7 is an explanatory view of an arrangement of an optical pickup device according to the present invention.
Figure 8:
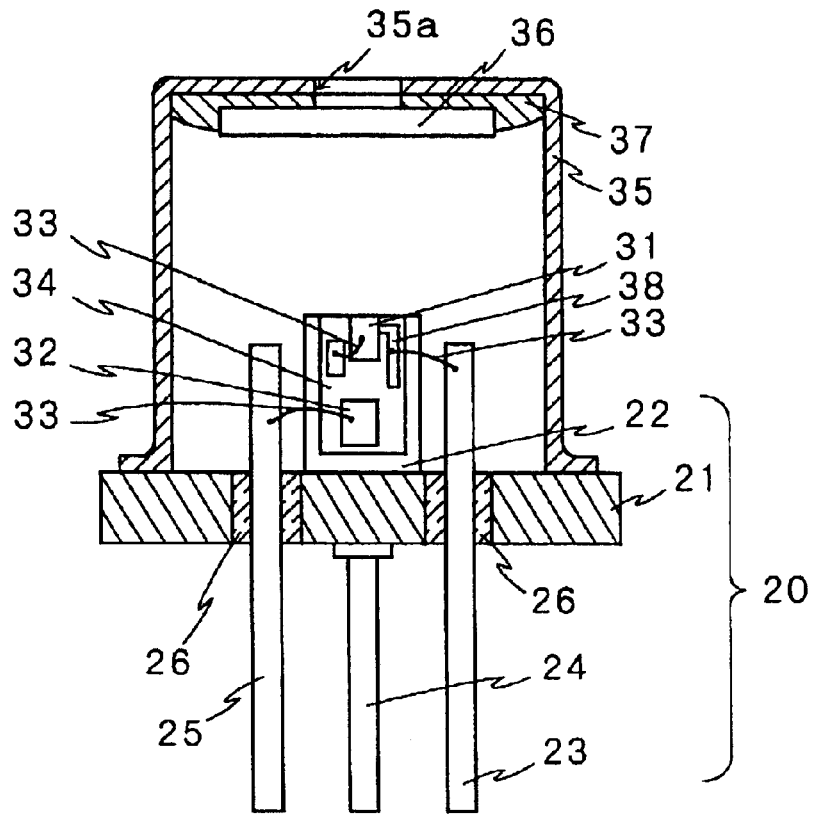
FIG. 8 is an explanatory view of an exemplar structure of a conventional semiconductor laser.
Figure 9A:
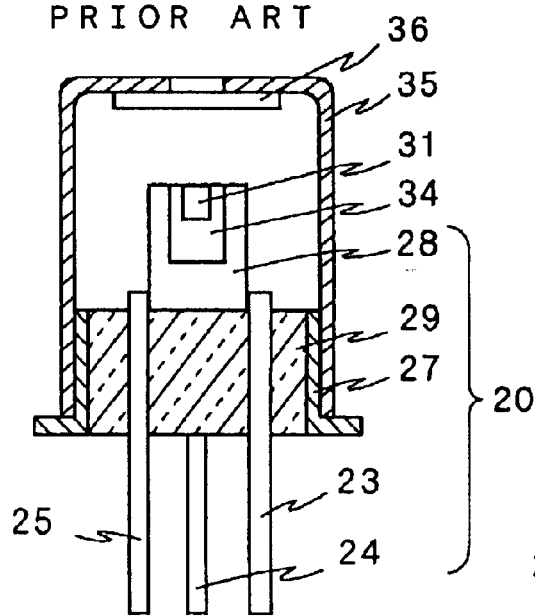
FIGS. 9A and 9B are explanatory views of an exemplary structure of a conventional semiconductor laser.
Figure 9B:
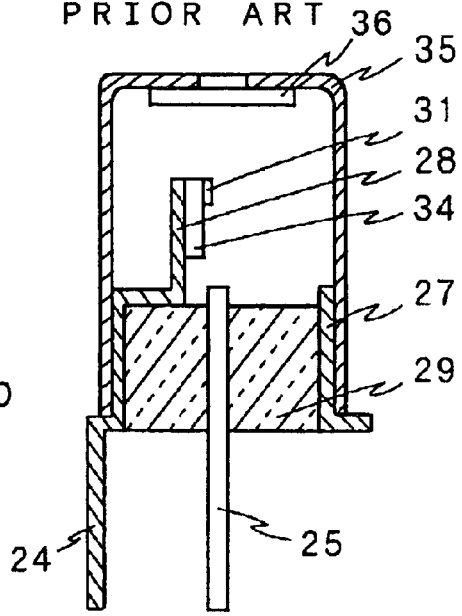

FIG. 7 is an explanatory view illustrating an outline of an embodiment in which a thin-type optical pickup is arranged by using such a semiconductor laser of small outer diameter. More particularly, the semiconductor laser 50 is disposed laterally and light beam from the semiconductor laser split into there beams by a grating 51 for using a three-beam method, these beams are collimated by a collimator lens 53 through a beam splitter 52 which separates reflected light from the emitted light beam, and the light beams are bent by 90° (direction of z axis) through a prism mirror (reflecting mirror) 54 for focusing on a surface of a disk 56 such as a DVD or a CD through an object lens 55. The reflected light from the disk 56 is then detected by a light detector 58 upon passing through, for instance, a concave lens 57 via the beam splitter 52. It should be noted that the semiconductor laser 50 and the light detector 58 are disposed within a substantially identical plane (xy surface) in FIG. 7.

In this manner, by employing an arrangement in which the semiconductor laser 50 is disposed to be turned sideways and in which concaves and convexes on surfaces of DVDs, CDs and the like are detected and writing on the DVDs or CDs is performed while irradiating laser beam in a direction parallel to the CD or the like, thinning of the optical pickup device will be dependent on the outer diameter of the semiconductor laser, and upon reducing this outer diameter, it is possible to arrange an optical pickup device of extremely thin size. By employing the semiconductor laser of the present invention which outer diameter is approximately 3.5 mmϕ as described above, it is possible to obtain an optical pickup device having a thickness of approximately 5 mm.

Accordingly to the present invention, while using a stem having a metallic base to be formed by the cold forging, it is possible to obtain a semiconductor laser employing a high output laser chip for DVD that has a large chip size and a large heat generating and also for CD-R/RW that has further larger chip size and heat generating, which is extremely small in size of approximately 3.5 mmϕ. Further, since it is possible to manufacture the heat sink as a single part of simple shape without causing any complications during the manufacturing processes, it may be of low cost and the cubic volume of the heat sink may be increased so that it is possible to obtain a semiconductor laser of superior heat radiation properties and of extremely high reliability.

By forming the shape of the tip end portions of the inner leads such that the interval between the leads becomes wider than that of the remaining portions, the sub-mount onto which the laser chip has been bonded may be mounted while coming extremely closer to the base so that the height of the heat sink may be reduced, and the height of the semiconductor laser may be reduced accordingly. Also when employing an insulating substrate such as one of aluminum nitride as the sub-mount, it is possible to secure a space of the heat sink for performing wire bonding so that it is not necessary to employ an expensive one with tungsten via being embedded therein, and it is possible to obtain a semiconductor laser of high output exhibiting superior reliability but of low costs.

It is accordingly possible to obtain an optical pickup device of extremely thin and small size also when the optical pickup device is designed for DVDs or CD-R/RWs. An optical pickup device employing the semiconductor laser of the present invention largely contributes to thinning and downsizing of electronic devices such as notebook type personal computers that employ laser light sources.

Although preferred examples have been described in some detail it is to be understood that certain changes can be made by those skilled in the art without departing from the spirit and scope of the invention as defined by the appended claims.

What is claimed is:

1. A semiconductor laser comprising:
   a base having a planar shape that is substantially circular;
   two leads that are respectively fixed to said base through insulating material;
   a heat sink that is provided on one surface side of said base, said heat sink having a surface with a width wider than a distance between said two leads, said surface being parallel to a plane formed by said two leads and perpendicular to said base; and
   a laser chip that is fixedly attached to said surface of said heat sink,
   wherein said two leads are provided to be substantially parallel to one diameter of said base and remote by a specified distance from said one diameter, and
   wherein said heat sink is fixedly provided to said base such that said heat sink does not contact the insulating material for fixing said two leads and such that an emitting portion of said laser chip is located in center of said base.

2. The semiconductor laser of claim 1 wherein a common lead is provided on the other surface side of said base, said common lead being fixedly attached at a position that is on a central line between said two leads when seen in a plan view and that is shifted from a peripheral end portion of said base towards a central point of said base by said specified distance.

3. The semiconductor laser of claim 1, wherein shapes of tip end portions of said two leads on said one surface side are deformed such that a distance between said tip end portions becomes larger than a distance between said two leads at portions other than said tip end portions.

4. The semiconductor laser of claim 1, wherein said heat sink is made of a copper block.

5. The semiconductor laser of claim 1, wherein said heat sink is formed of a copper plate by punching and bending.

6. The semiconductor laser of claim 1, wherein said laser chip is fixedly attached to said heat sink through a sub-mount, wherein said sub-mount is made of AlN, and wherein one electrode of said laser chip is electrically connected to said heat sink through wire bonding via a relay conductive member that is provided on a surface of said sub-mount.

7. The semiconductor laser of claim 6, wherein said laser chip is a laser chip for DVDs or CD-R/RWs.

8. A semiconductor laser comprising:
   a base having a planar shape that is substantially circular;
   two leads that are respectively fixed to said base through insulating material;
   a heat sink that is provided on one surface side of said base, said heat sink having a surface with a width wider than a distance between said two leads, said surface being parallel to a plane formed by said two leads and perpendicular to said base; and
   a laser chip that is fixedly attached to said surface of said heat sink,
   wherein shapes of tip end portions of said two leads on said one surface side are deformed such that a distance between said tip end portions of said two leads becomes larger than said distance between said two leads at portions other than said tip end portions.

9. A method for manufacturing the semiconductor laser of claim 3 or 8, comprising the steps of:
   fixing the two leads to the base through insulating material so as to pierce through the base,
   deforming the tip end portions of the two leads on the one surface side of the base through press such that the distance between the tip end portions becomes larger than the distance between the two leads at portions other than the tip end portions, and
   fixedly attaching the laser chip onto the heat sink that is provided on the one surface side of the base.

10. An optical pickup device comprising:
    a semiconductor laser;
    a grating;
    a beam splitter for splitting a light beam that is emitted from said semiconductor laser and a returning light upon being reflected;
    a collimator lens which collimates the light beam emitted from the semiconductor laser;
    a reflecting mirror for bending the light beam from the semiconductor laser into a right-angled direction;
    an object lens for converging the light beam on a disk; and
    an optical detector for detecting the returning light reflected by the disk and split through said beam splitter,
    wherein said semiconductor laser is the semiconductor laser of claim 1 or 8.

11. The semiconductor laser of claim 1, wherein a diameter of said base, which is a maximum outer diameter of said semiconductor laser, is not more than 3.5 mm.

12. The semiconductor laser of claim 8, wherein a diameter of said base, which is a maximum outer diameter of said semiconductor laser, is not more than 3.5 mm.

* * * * *